United States Patent [19]
Chin et al.

[11] Patent Number: 5,705,436
[45] Date of Patent: Jan. 6, 1998

[54] METHOD FOR FORMING A POLY LOAD RESISTOR

[75] Inventors: Hsien Wei Chin, Hsin Chu; Jhon-Jhy Liaw, Taipei, both of Taiwan

[73] Assignee: Taiwan Semiconductor Manufacturing Company, Ltd., Hsin-Chu, Taiwan

[21] Appl. No.: 703,085

[22] Filed: Aug. 26, 1996

[51] Int. Cl.⁶ .............................. H01L 21/8244
[52] U.S. Cl. ................ 438/238; 438/381; 438/382
[58] Field of Search ........................... 438/238, 381, 438/382

[56] References Cited

U.S. PATENT DOCUMENTS

| | | | |
|---|---|---|---|
| 5,108,945 | 4/1992 | Matthews | 437/60 |
| 5,164,338 | 11/1992 | Graegor et al. | 437/233 |
| 5,381,046 | 1/1995 | Cederbaum et al. | 257/904 |

OTHER PUBLICATIONS

S. Wolf, "Silicon Processing For The VLSI Era–Volz", Lattice Press, Sunset Beach, CA, pp. 577, 578, 1990.

*Primary Examiner*—Jey Tsai
*Attorney, Agent, or Firm*—George O. Saile; Stephen B. Ackerman

[57] ABSTRACT

A physical implementation and method for achieving it are described for a load resistor and bus line subcircuit such as might be used in an SRAM cell. This was achieved by using two layers of polysilicon. The first polysilicon layer has low resistivity and serves to make effective contact to the drain regions of the FETs involved in the circuit. The second polysilicon layer has high resistivity and is used to form the load resistor as well as the collector bus line and resistor-drain connection. Formation of the latter two objects is achieved by providing a refractory metal underlay to the second polysilicon layer in the appropriate areas and then heating the structure so as to convert said refractory metal to its silicide. This process avoids the use of an ion implantation step during which some encroachment of the ions could occur, thereby retaining good control of the resistor dimensions.

18 Claims, 3 Drawing Sheets

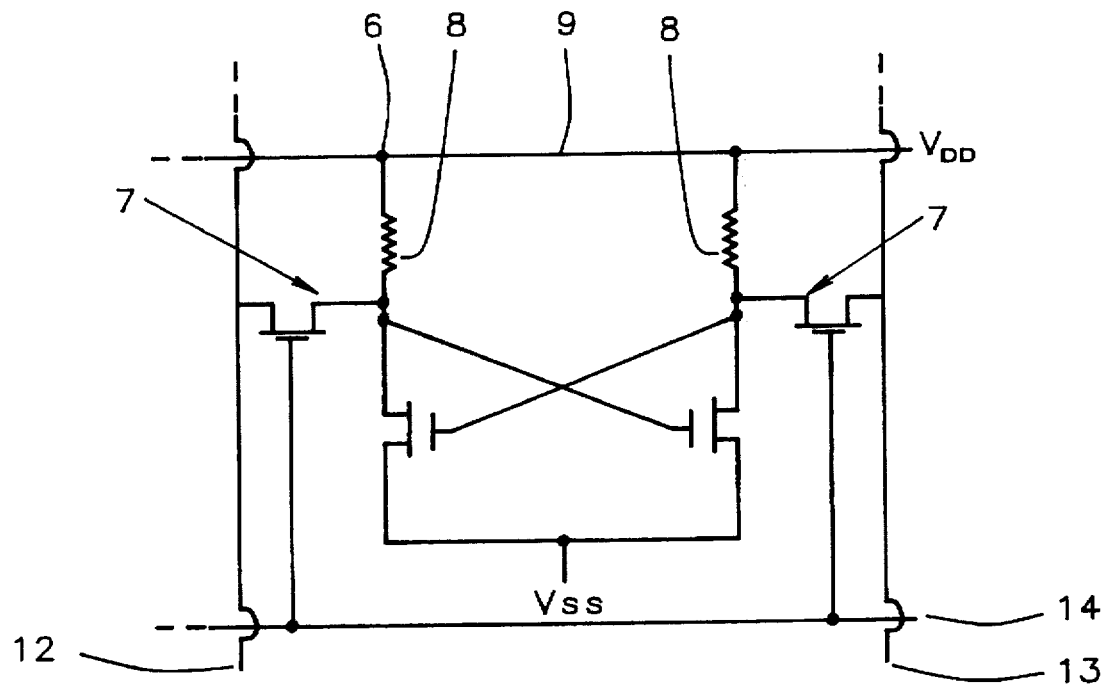
FIG. 1 – Prior Art
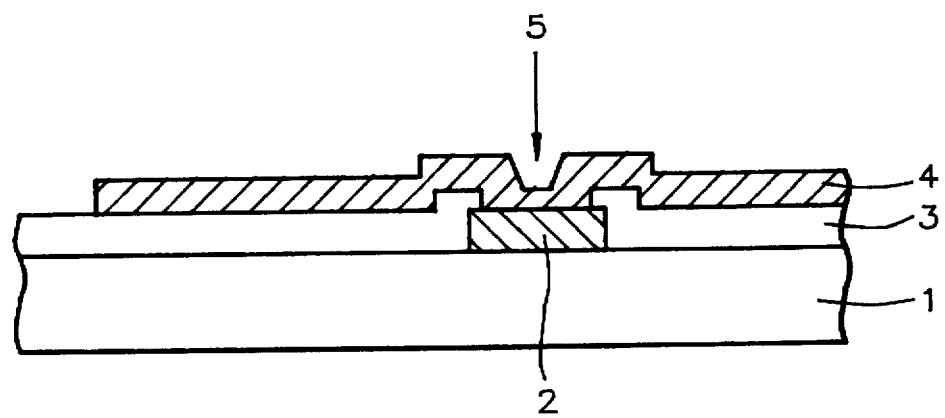
FIG. 2 – Prior Art

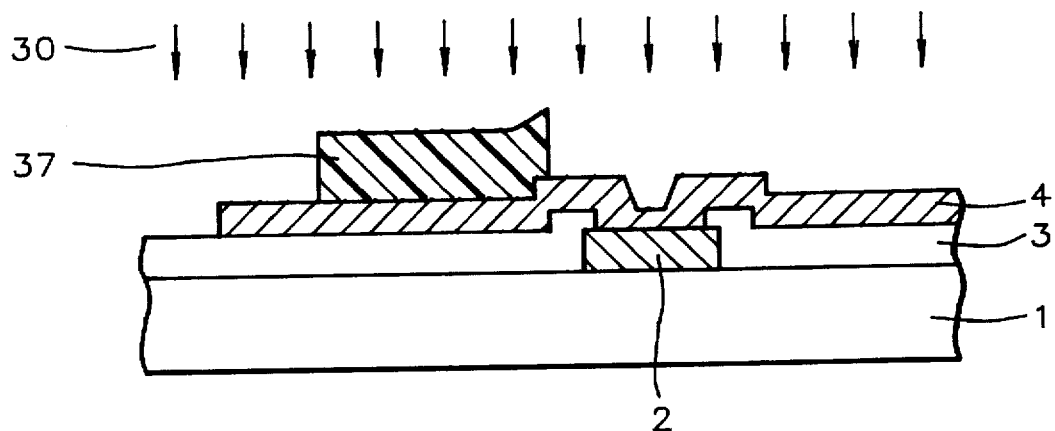
FIG. 3 - Prior Art
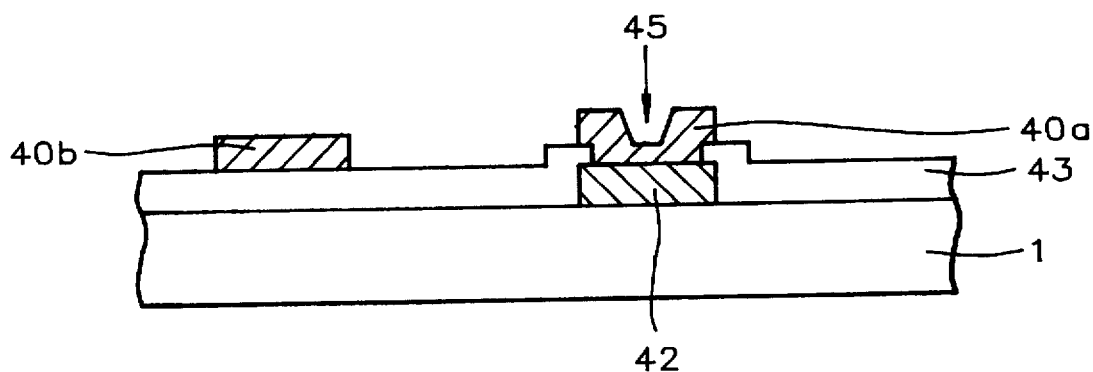
FIG. 4
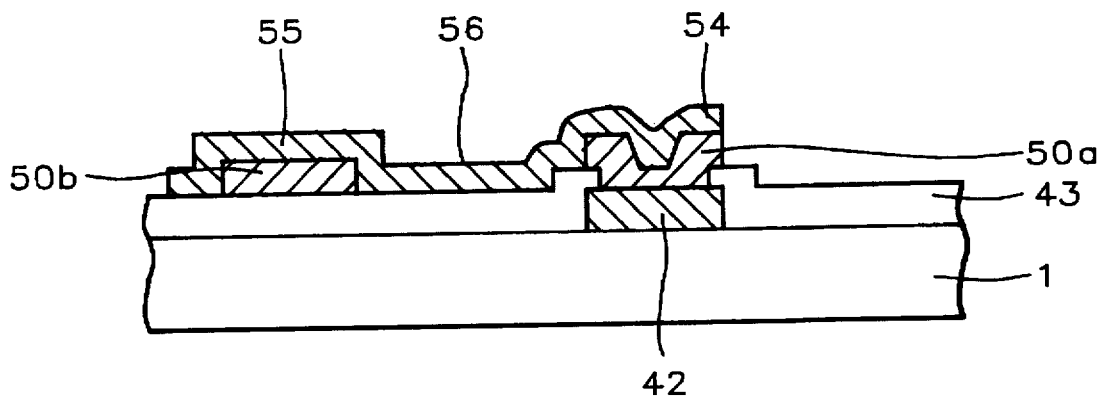
FIG. 5

5,705,436

METHOD FOR FORMING A POLY LOAD RESISTOR

BACKGROUND OF THE INVENTION (1) Field of the Invention

The invention relates to integrated circuits and to methods for forming busses and resistors therein.

(2) Description of the Prior Art

FIG. 1 is a schematic diagram of a single Static Random Access Memory (SRAM) cell of a sort that is currently in use within the integrated circuit art. Voltage to the drains of the four Field Effect Transistors (FETs) that are included in the circuit is carried by $V_{DD}$ bus 9 and connected to them through load resistors 8. The word line 14 and the true and complement bit lines 12 and 13 are standard for circuits of this type. The physical implementation of a part of this circuit, namely the subcircuit that lies between points 6 and 7, forms the subject matter of the present invention.

Referring now to FIG. 2, we show, in schematic cross-section, a view of the first step in a process for implementing said subcircuit, as practiced in the current art. Integrated Circuit (IC) 1 includes on its surface FETs whose drain regions are contacted through low resistance polycrystalline silicon (polysilicon) electrodes such as 2. An insulating layer 3 is deposited over the surface and contact holes (such as 5) are formed therein so that when second polysilicon layer 4 (which has high resistivity) is deposited, it contacts polysilicon electrodes 2.

The next step (in the prior art) is to form the load resistor and bus and to reduce the contact resistance to electrodes 2. The method for accomplishing this is illustrated in FIG. 3. A layer of photoresist is deposited over the surface and patterned so as to cover only the area where the resistor is to be (designated as 37 in the figure). Ions 30 of suitable dopant material are then implanted in the structure thereby significantly reducing the resistance of polysilicon layer 4 everywhere except under photoresist layer 37. The latter is then stripped away in the usual manner leaving in place bus and drain contact regions separated by a resistor.

The above-described method, which exemplifies the current state of the art, is subject to a significant drawback. Although not obvious from FIG. 3 (which is schematic and not drawn to scale) the dimensions of the resistor are very small. Typically, in the current art, a load resistor formed by the method illustrated in FIG. 3 would measure about 1.5 by 0.5 microns. During the ion implantation step, that is intrinsic to this method of resistor formation, a certain amount of encroachment, or undercutting, of protective layer 37 by the arriving ions is inevitable. This occurs as a result of a variety of factors that depend on the particular process being used and represents an uncertainty in the final dimensions of the resistor under formation of about 30–50%. As dimensions within ICs continue to shrink, this problem will become increasingly more severe.

We are not aware of any prior art that anticipates the structure and method of the present invention (as will be described below). S. Wolf, in "Silicon processing for the VLSI era" vol. 2 page 578, gives a brief description of the formation of the power line, $V_{DD}$ lines, and the resistor in an SRAM cell as follows (line 5): "The second poly layer is used to form both the high valued load resistors and the low-resistance $V_{DD}$ lines." This statement does not distinguish between the method of the prior art and the method of the present invention and could be applied to either one. In particular, no mention is made of the introduction of a refractory metal layer which, as will be seen, is a key feature of the present invention.

SUMMARY OF THE INVENTION

It has been an object of the present invention to provide a bus and load resistor subcircuit wherein the value of the load resistor is subject to tight control.

Another object of the present invention has been to provide a method for manufacturing said subcircuit in an efficient and cost effective manner.

These objects have been achieved by using two layers of polysilicon. The first polysilicon layer has low resistivity and serves to make effective contact to the drain regions of the FETs involved in the circuit (generally an SRAM cell). The second polysilicon layer has high resistivity and is used to form the load resistor as well as the collector bus line and resistor-drain connection. Formation of the latter two objects is achieved by providing a refractory metal underlay to the second polysilicon layer in the appropriate areas and then heating the structure so as to convert said refractory metal to its silicide. This process avoids the use of an ion implantation step during which some encroachment of the ions could occur, thereby retaining good control of the resistor dimensions.

BRIEF DESCRIPTION OF THE DRAWINGS

FIG. 1 is a schematic circuit diagram of an SRAM cell.

FIGS. 2 and 3 illustrate the process used in the current art to implement a portion of the circuit shown in FIG. 1.

FIGS. 4 and 5 illustrate the process of the present invention as used to implement said portion of the circuit shown in FIG. 1.

DESCRIPTION OF THE PREFERRED EMBODIMENTS

Figure 6:
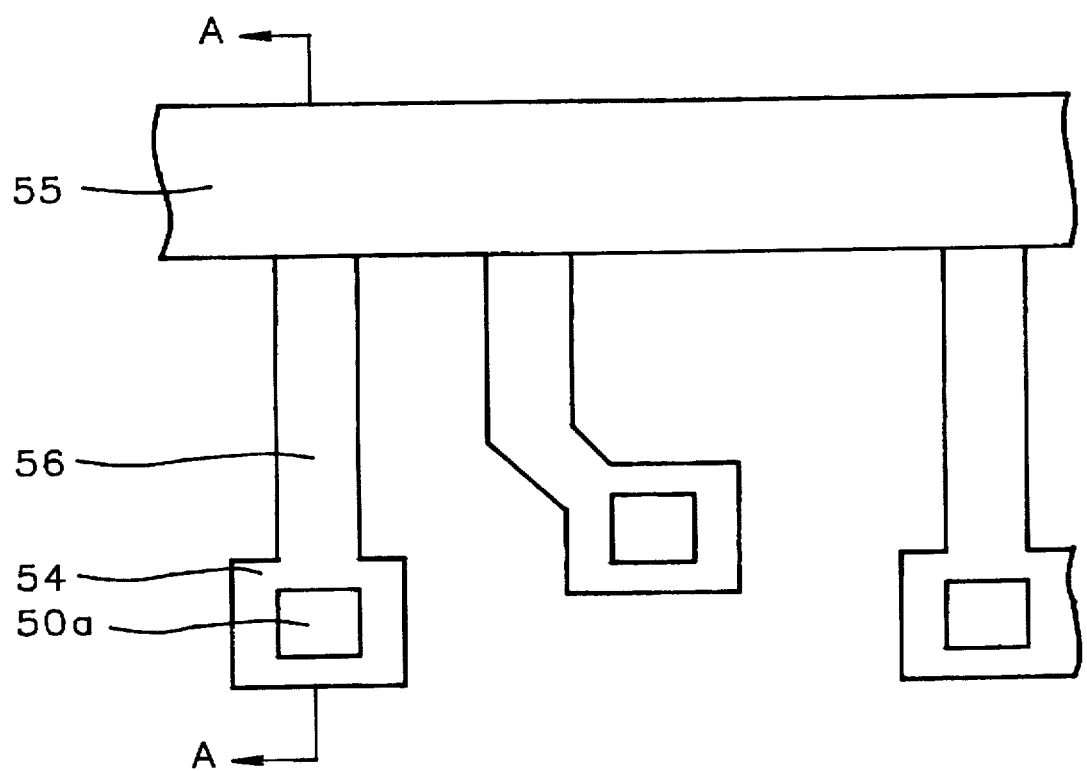
FIG. 6 is a plan view, a cross-section of which is shown in FIG. 5.

The present invention is concerned with a method and structure relative to load resistors and busses in integrated circuits, particularly for the load resistor and $V_{DD}$ bus in a Static Random Access Memory (SRAM) cell.

Referring now to FIG. 4, the starting point for manufacturing a preferred embodiment of the present invention is partially completed integrated circuit (IC) 1 in whose upper surface source, gate, and drain regions have already been formed. Such regions comprise areas, at the surface, to which electrical contact will need to be made and which will need to be connected to other parts of the IC.

Processing begins with the deposition of a first layer of polysilicon (or possibly a polycide such as WSi), whose thickness is between about 2,000 and 5,000 Angstroms and whose sheet resistance is between about 10 and 30 ohm/sq., onto the surface of IC I where it is patterned and etched so as to provide electrodes (such as 42) for the afore-mentioned contact areas. This is followed by the deposition of insulating layer 43, having a thickness between about 1,000 and 2,000 Angstroms and comprising silicon oxide over the entire IC upper surface. Contact holes, such as 45, are then etched in layer 43 so as to expose the upper surfaces of electrodes 42.

A layer of a refractory metal, such as tungsten, TiN, or TiW between about 500 and 2,000 Angstroms thick is now deposited and then patterned and etched so as to form contact areas 40a as well as bus-shaped regions 40b. Note that the selection of a refractory metal (as opposed to any metal) at this point in the process implies that subsequent high temperature processing of the IC will continue to be possible.

Referring now to FIG. 5, the next step is the deposition of a second layer of polysilicon whose thickness is between about 500 and 1,500 Angstroms and whose sheet resistance is between about 1 and 1,00 megohm/sq. (depending on the particular resistor forming process). Said second layer is then patterned and etched to remove all of it except three main regions. These are the overlaps of the two previously formed refractory metal areas (the electrode area 54 and the bus-shaped area 55) as well as resistor strip 56 (comprising only said second layer of polysilicon) connecting the bus area to the electrode area.

The final step in the formation of this preferred embodiment is to heat the entire structure to a sufficient extent as to cause the refractory metal areas 40a and 40b (in FIG. 4) to react with the second polysilicon layer and be thereby converted to their silicides (areas 50a and 50b in FIG. 5). Said heating step comprised exposure to a temperature between about 500 and 700 °C. for between about 1 and 20 minutes in an atmosphere of nitrogen.

FIG. 6 shows a plan view of the structure as seen in FIG. 5 at cross-section AA. Resistor 56, typically measuring about 1.5 by 0.5 microns had a resistance value between about 100 and 1,000 megohms.

In a typical application of the above preferred embodiment, such an SRAM cell, resistor 56 and bus 40b would be a load resistor and a drain voltage bus, respectively.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a resistor and bus as parts of an integrated circuit, comprising:
   (a) providing a partially complete integrated circuit having a surface that includes contact regions;
   (b) depositing a first layer of polysilicon or polycide;
   (c) patterning and etching said first layer of polysilicon to form interconnections and electrodes for said contact regions;
   (d) depositing a layer of insulating material;
   (e) etching contact holes through said insulating layer down to the level of said first polysilicon layer;
   (f) depositing a layer of TiN;
   (g) patterning and etching said layer of TiN to fill said contact holes and to assume the shape of the bus;
   (h) depositing a second layer of polysilicon;
   (i) patterning and etching said second polysilicon layer to assume the shape of the resistor and to overlay said electrodes and said bus shaped area of TiN; and
   (j) heating said integrated circuit, thereby converting said layer of TiN to its silicide.

2. The method of claim 1 wherein the thickness of said first polysilicon or polycide layer is between about 2,000 and about 5,000 Angstroms.

3. The method of claim 1 wherein the sheet resistance of said first polysilicon or polycide layer is between about 10 and 30 ohm/sq.

4. The method of claim 1 wherein said insulating layer comprises silicon oxide.

5. The method of claim 1 wherein the thickness of said insulating layer is between about 1,000 and about 2,000 Angstroms.

6. The method of claim 1 wherein the thickness of said layer of TiN is between about 500 and about 2,000 Angstroms.

7. The method of claim 1 wherein the thickness of said second polysilicon layer is between about 500 and about 1,500 Angstroms.

8. The method of claim 1 wherein the sheet resistance of said second polysilicon layer is between about 1 and 1,000 megohm/sq.

9. The method of claim 1 wherein the integrated circuit is heated for between about 1 and about 20 minutes at a temperature between about 500° and 700° C. in an atmosphere of nitrogen.

10. A method for manufacturing a resistor and bus as parts of an integrated circuit, comprising:
   (a) providing a partially complete integrated circuit having a surface that includes contact regions;
   (b) depositing a first layer of polysilicon or polycide;
   (c) patterning and etching said first layer of polysilicon to form interconnections and electrodes for said contact regions;
   (d) depositing a layer of insulating material;
   (e) etching contact holes through said insulating layer down to the level of said first polysilicon layer;
   (f) depositing a layer of TiW;
   (g) patterning and etching said layer of TiW to fill said contact holes and to assume the shape of the bus;
   (h) depositing a second layer of polysilicon;
   (i) patterning and etching said second polysilicon layer to assume the shape of the resistor and to overlay said electrodes and said bus shaped area of TiW; and
   (j) heating said integrated circuit, thereby converting said layer of TiW to its silicide.

11. The method of claim 10 wherein the thickness of said first polysilicon or polycide layer is between about 2,000 and about 5,000 Angstroms.

12. The method of claim 10 wherein the sheet resistance of said first polysilicon or polycide layer is between about 10 and 30 ohm/sq.

13. The method of claim 10 wherein said insulating layer comprises silicon oxide.

14. The method of claim 10 wherein the thickness of said insulating layer is between about 1,000 and about 2,000 Angstroms.

15. The method of claim 10 wherein the thickness of said TiW layer is between about 500 and about 2,000 Angstroms.

16. The method of claim 10 wherein the thickness of said second polysilicon layer is between about 500 and about 1,500 Angstroms.

17. The method of claim 10 wherein the sheet resistance of said second polysilicon layer is between about 1 and 1,000 megohm/sq.

18. The method of claim 10 wherein the integrated circuit is heated for between about 1 and about 20 minutes at a temperature between about 500° and 700° C. in an atmosphere of nitrogen.

* * * * *